United States Patent
Ando et al.

(10) Patent No.: US 9,472,408 B2
(45) Date of Patent: *Oct. 18, 2016

(54) NITRIDATION ON HDP OXIDE BEFORE HIGH-K DEPOSITION TO PREVENT OXYGEN INGRESS

(71) Applicant: International Business Machines Corporation, Armonk, NY (US)

(72) Inventors: Takashi Ando, Tuckahoe, NY (US); Veeraraghavan S. Basker, Schenectady, NY (US); Johnathan E. Faltermeier, San Jose, CA (US); Hemanth Jagannathan, Guilderland, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/062,911

(22) Filed: Mar. 7, 2016

(65) Prior Publication Data

US 2016/0225629 A1 Aug. 4, 2016

Related U.S. Application Data

(63) Continuation of application No. 14/609,782, filed on Jan. 30, 2015.

(51) Int. Cl.
*H01L 21/28* (2006.01)
*H01L 21/02* (2006.01)

(52) U.S. Cl.
CPC ... *H01L 21/28238* (2013.01); *H01L 21/02164* (2013.01); *H01L 21/02186* (2013.01); *H01L 21/02225* (2013.01); *H01L 21/02227* (2013.01); *H01L 21/02296* (2013.01); *H01L 21/02299* (2013.01); *H01L 21/02332* (2013.01)

(58) Field of Classification Search
CPC .................. H01L 21/28158; H01L 21/02164; H01L 21/02225; H01L 21/0022; H01L 21/02227; H01L 21/02296; H01L 21/02299; H01L 21/02332
See application file for complete search history.

(56) References Cited

U.S. PATENT DOCUMENTS

| | | | |
|---|---|---|---|
| 2011/0221012 A1* | 9/2011 | Bu | H01L 21/28088 257/411 |
| 2012/0286374 A1 | 11/2012 | Bu et al. | |
| 2016/0013107 A1 | 1/2016 | Won et al. | |

OTHER PUBLICATIONS

Takashi Ando, et al., Pending U.S. Appl. No. 14/609,782 entitled "Nitridation on HDP Oxide Before High-K Deposition to Prevent Oxygen Ingress" filed with the U.S. Patent and Trademark Office on Jan. 30, 2015.
List of IBM Patents or Patent Applications Treated As Related (Appendix P), Filed Mar. 7, 2016, 2 pages.

* cited by examiner

*Primary Examiner* — Thanhha Pham
(74) *Attorney, Agent, or Firm* — Cantor Colburn LLP; Vazken Alexanian

(57) ABSTRACT

A method of reducing a migration of oxygen into a high-k dielectric layer of a semiconducting device is disclosed. An oxide layer of the semiconducting device is deposited on a substrate. A chemical composition of a top portion of the oxide layer is altered. The high-k dielectric layer is deposited on the top portion of the oxide layer to form the semiconducting device. The altered chemical composition of the top portion of the oxide layer reduces migration of oxygen into the high-k dielectric layer.

1 Claim, 10 Drawing Sheets

US 9,472,408 B2

NITRIDATION ON HDP OXIDE BEFORE HIGH-K DEPOSITION TO PREVENT OXYGEN INGRESS

CROSS-REFERENCE TO RELATED APPLICATIONS

The present application is a continuation application of U.S. patent application Ser. No. 14/609,782 filed on Jan. 30, 2015, the contents of which are incorporated by reference herein.

BACKGROUND

The present invention relates generally to methods of manufacturing a transistor, and more specifically, to a method of reducing oxygen migration into a high-k dielectric layer of a transistor during manufacture of the transistor.

In various high-k metal gate (HKMG) transistors, a source and a drain are built into a substrate and a gate structure is built on top of the substrate. The gate structure includes gate material in a gap between flowable oxide materials built on top of the substrate. The gap is generally lined with a high-k dielectric material. However, since the high-k dielectric material is in contact with the top surfaces of the flowable oxide material during a manufacturing stage, oxygen molecules can migrate from the flowable oxide material into the high-k dielectric material. Once inside the high-k dielectric material, the oxygen can affect the performance of the resulting HKMG transistor. Therefore, there is a desire to reduce or prevent migration of oxygen atoms into the high-k dielectric layer of the gate structure.

SUMMARY

According to one embodiment of the present invention, a method of reducing migration of oxygen into a high-k dielectric layer of a semiconducting device includes: depositing an oxide layer of the semiconducting device on a substrate; altering a chemical composition of a top portion of the oxide layer; and depositing the high-k dielectric layer on the top portion of the oxide layer to form the semiconducting device, wherein the altered chemical composition of the top portion of the oxide layer reduces the migration of oxygen into the high-k dielectric layer.

According to another embodiment of the present invention, a method of reducing oxygen migration into a high-k dielectric layer of a transistor during manufacture of the transistor includes: depositing an oxide layer of the transistor on a substrate; altering a chemical composition of a top portion of the oxide layer; and depositing the high-k dielectric material on the top portion of the oxide layer, wherein the altered chemical composition top portion of the oxide layer reduces migration of oxygen from the oxide layer into the high-k dielectric layer.

According to another embodiment of the present invention, a method of manufacturing a high-k metal gate (HKMG) transistor includes: depositing an oxide layer on a substrate; altering a chemical composition of a top portion of the oxide material; and depositing a layer of high-k dielectric material on the top portion of the oxide material, wherein the altered chemical composition of the top portion of the oxide layer reduces a migration of oxygen into the layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2-9 show various stages of a manufacturing process of the present invention in which migration of oxygen into the high-k dielectric layer is reduced, hindered or prevented in a resulting transistor or semiconducting device, in which:

FIG. 2 shows a first stage in which various sources and drains have been formed within a substrate;

FIG. 3 shows a second stage in which a flowable oxide (FOX) is deposited in gaps between dummy gates on a substrate;

FIG. 4 shows a third stage in which nitridation is performed on the flowable oxide;

FIG. 5 shows a fourth manufacturing stage in which the thin nitride layers covering the dummy gates are removed;

FIG. 6 shows a manufacturing fifth stage in which the dummy gates are removed;

FIG. 7 shows a sixth manufacturing stage in which a high-k dielectric layer is deposited;

FIG. 8 shows a seventh manufacturing stage in which a titanium nitride layer is deposited;

FIG. 9 shows an eighth manufacturing stage in which amorphous silicon is deposited in the gaps.

DETAILED DESCRIPTION

Figure 1:
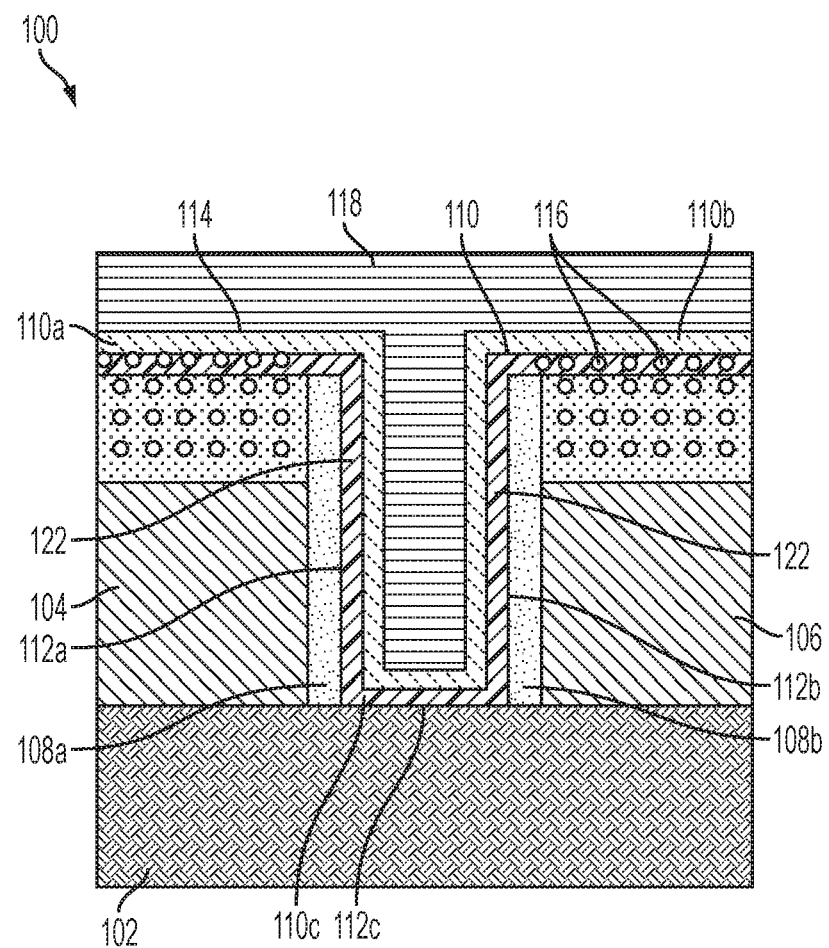
FIG. 1 shows a transistor in one stage of a conventional high-k metal gate (HKMG) transistor manufacturing process.

FIG. 1 shows a transistor 100 in one stage of a conventional high-k metal gate (HKMG) transistor manufacturing process. The transistor 100 includes a substrate 102 and a gate structure includes a first flowable oxide (FOX) layer segment 104 and a second flowable oxide layer segment 106 deposited on the substrate 102. The first flowable oxide layer segment 104 and second flowable oxide layer segment 106 are separated by a gap which includes spacers 108a and 108b. A layer 110 of high-k dielectric material is deposited. The high-k dielectric layer 110 includes a first segment 110a that covers a top surface of the first flowable oxide layer segment 104, a second segment 110b that covers a top surface of the second flowable oxide layer segment 106 and a third segment 110c that lines the gap between the first flowable oxide layer segment 104 and second flowable oxide layer segment 106. In particular, the third segment 110c lines surface 112a of spacer 108a, surface 112b of spacer 108b and surface 112c of substrate 102 in the gap. A titanium nitride (TiN) layer 114 covers the high-k dielectric layer 110. A gate material 118 (e.g., amorphous silicon) is deposited on top of the TiN layer 114 in the gap.

Contact between the first segment 110a and first flowable oxide layer segment 104 allows free oxygen 116 within first flowable oxide layer segment 104 to migrate into first segment 110a. Similarly, contact between the second segment 110b and flowable oxide layer segment 106 allows free oxygen 116 within second flowable oxide layer segment 106 to migrate into second segment 110b. The rate of oxygen migration increases during an annealing process in which temperatures are elevated. Once inside the high-k dielectric layer 110, the free oxygen 116 diffuses quickly throughout the high-k dielectric layer 110 via oxygen vacancy sites. Thus, free oxygen 116 that has migrated into either the first segment 110a or the second segment 110b generally flows into the third segment 110c as shown by migration arrows 122. While the first segment 110a and the second segment 110b are generally removed via polishing during subsequent stages of the manufacturing process and are generally not present in the finished transistor, the third segment 110c remains as a part of the finished transistor 100. The presence of oxygen into the third segment 110c has an effect of various properties of the finished transistor, such as on threshold voltage $V_t$ shift.

FIGS. 2-5 show various stages of a manufacturing process of the present invention in which migration of oxygen into the high-k dielectric layer is reduced, hindered or prevented in a resulting transistor or semiconducting device.

Figure 2:
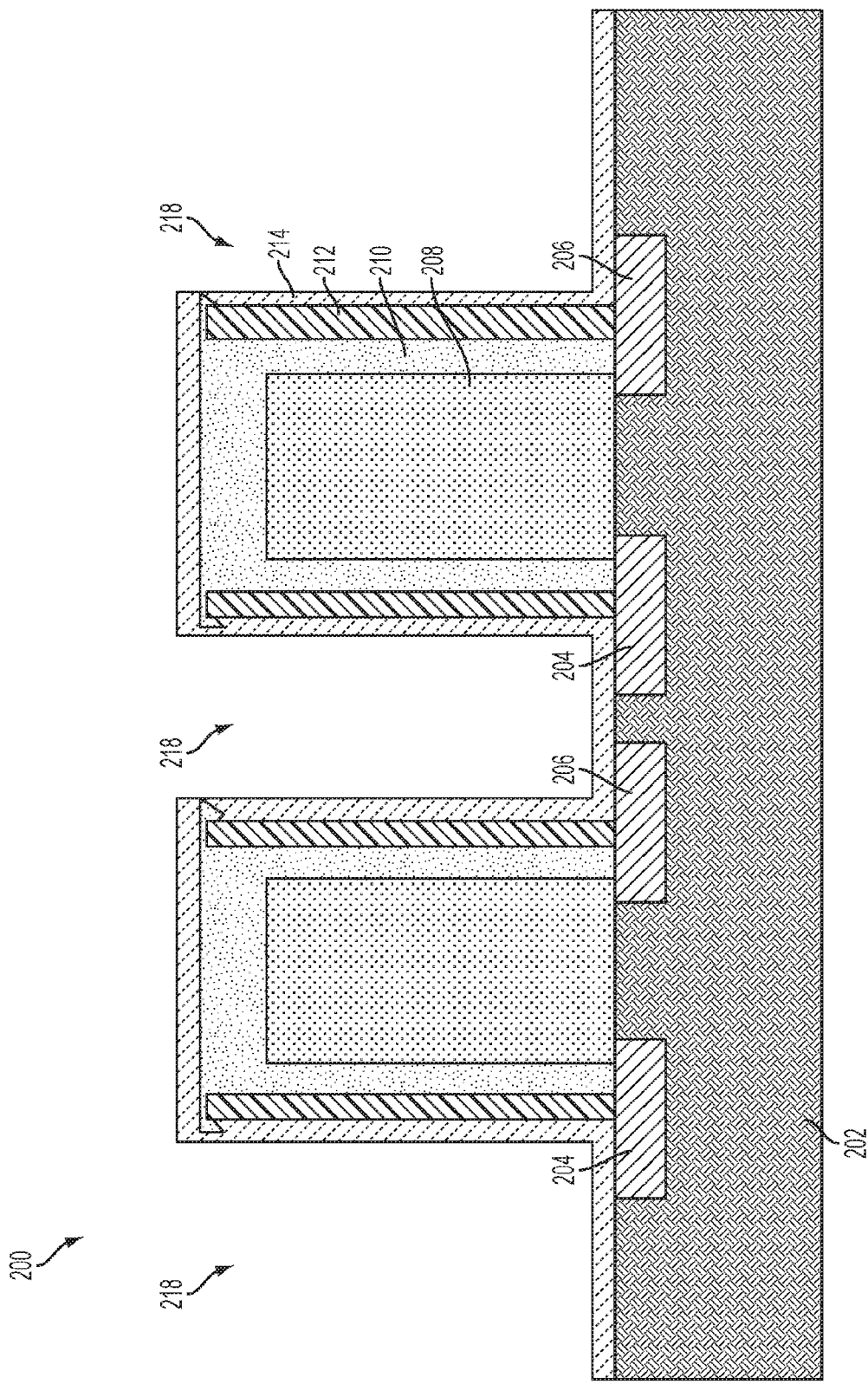

FIG. 2 shows a first stage 200 in which various sources 204 and drains 206 have been formed within a substrate 202. The substrate 202 may include a thin silicon fin or a silicon-on-insulator (SOI) layer. Dummy gates 208 have been formed on the substrate 202 and spacers 210 have been deposited to cover the dummy gates 208. An epitaxial formation layer 212 has been deposited alongside the spacers 210 and a thin nitride layer of poly open CMP liner (POC liner) 214 has been formed to cover the spacers 210, epitaxial formation layer 212 and exposed surfaces of the substrate 202. The dummy gates 208 are separated by gaps 218.

Figure 3:
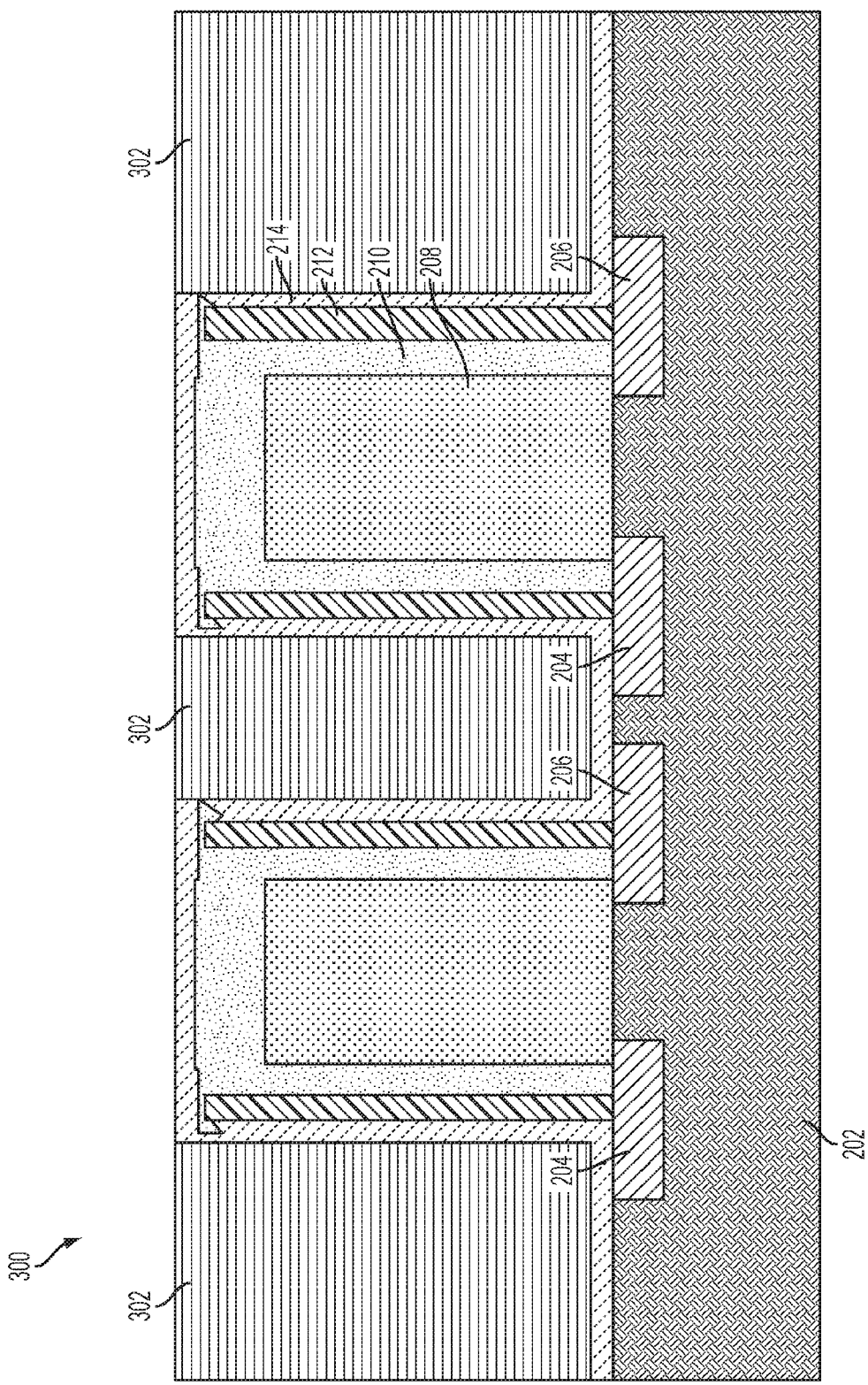

FIG. 3 shows a second stage 300 in which a flowable oxide (FOX) 302 is deposited in the gaps 218. In alternate embodiments, the flowable oxide 302 may be replaced with a high-density plasma oxide (HDP) material. The flowable oxide 302 is deposited and polished in the second stage 300.

Figure 4:
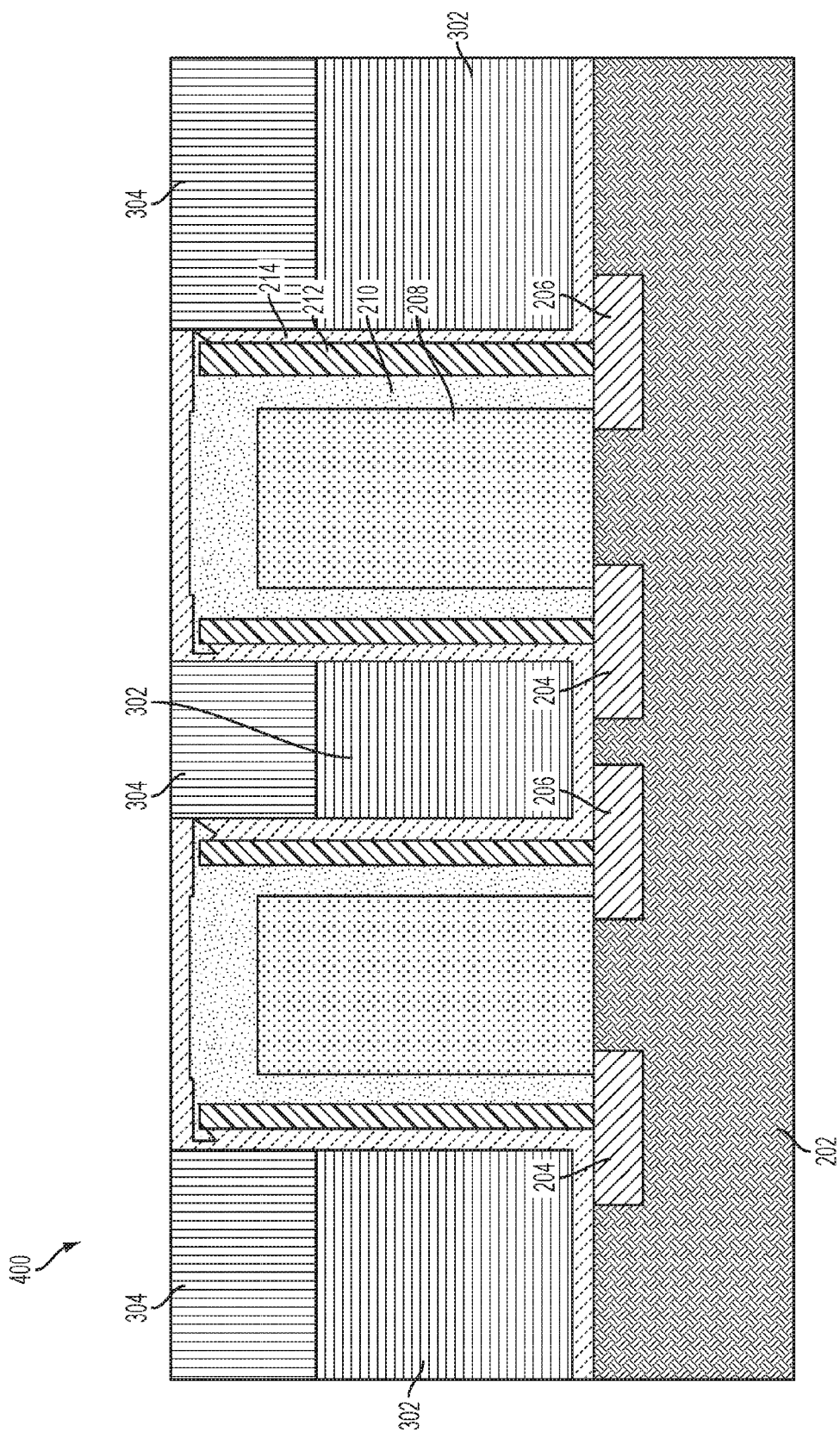

FIG. 4 shows a third stage 400 in which nitridation is performed on the flowable oxide 302. The nitridation process diffuses nitrogen into a top oxide layer portion 304 of the flowable oxide 302 thereby changing its chemical composition. The flowable oxide 302 below the top oxide layer portion 304 is unaffected by the nitridation process. The nitridation process includes diffusing nitrogen into the top oxide layer portion 304. In various embodiments, diffusing the nitrogen may include at least one of nitrogen implantation into the top oxide layer portion 304, annealing the oxide material under an ammonia ($NH_3$) ambient, performing a plasma treatment on the oxide material with nitrogen in the plasma, performing a plasma treatment on the oxide material with ammonia in the plasma, etc. As a result of the nitridation process, the top oxide layer portion 304 may form stable SiON bonds that therefore provide a seal that prevents or reduces a flow of oxygen from the flowable oxide 302 via the top oxide layer portion 304.

Figure 5:
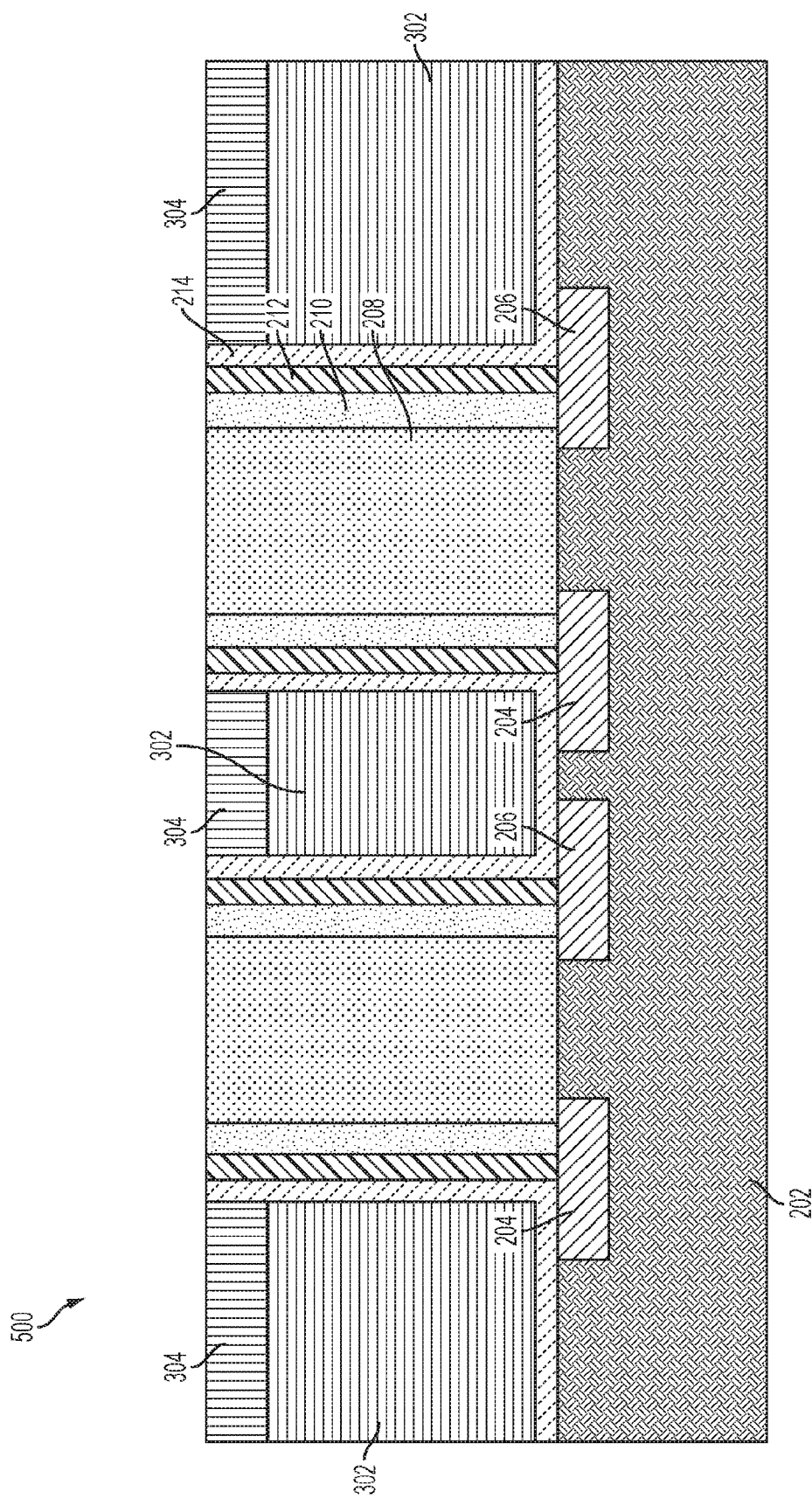

FIG. 5 shows a fourth manufacturing stage 500 in which the thin nitride layers covering the dummy gates 208 are removed. The nitride layers may be removed using various methods including, for example, chemical mechanical polishing techniques. Removing the nitride cap exposed the top surface of the dummy gates 208.

Figure 6:
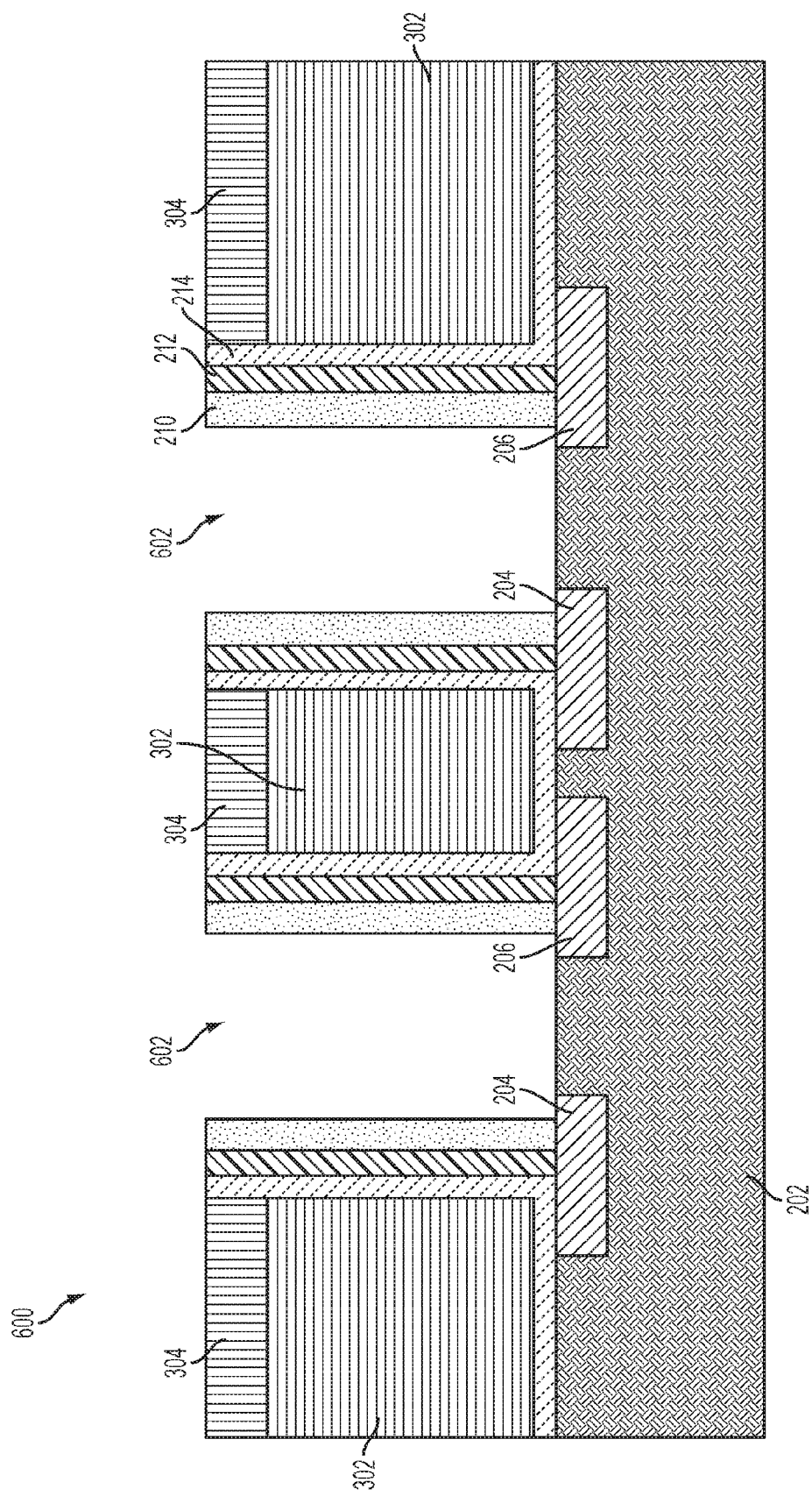
Figure 7:
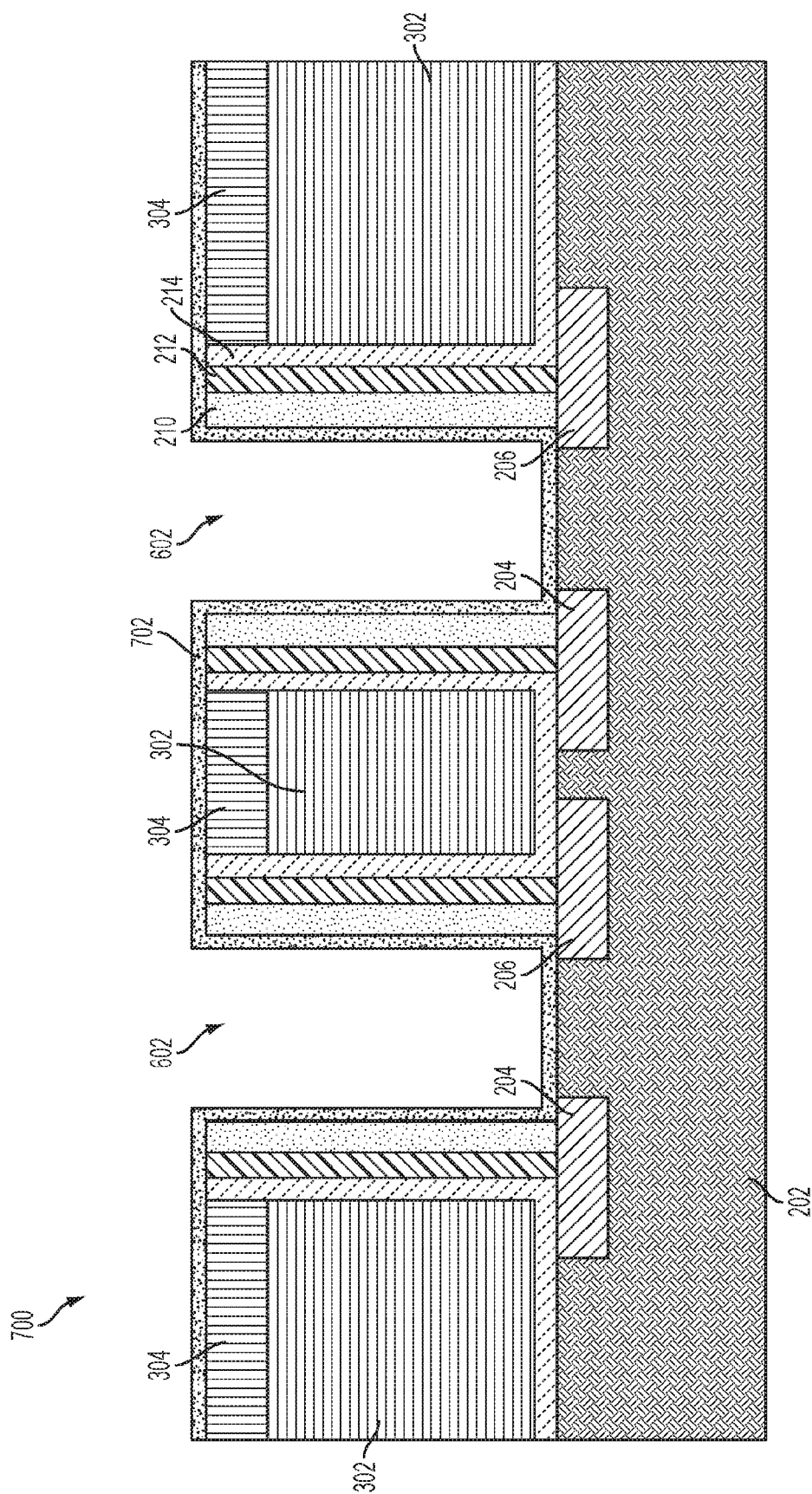
Figure 8:
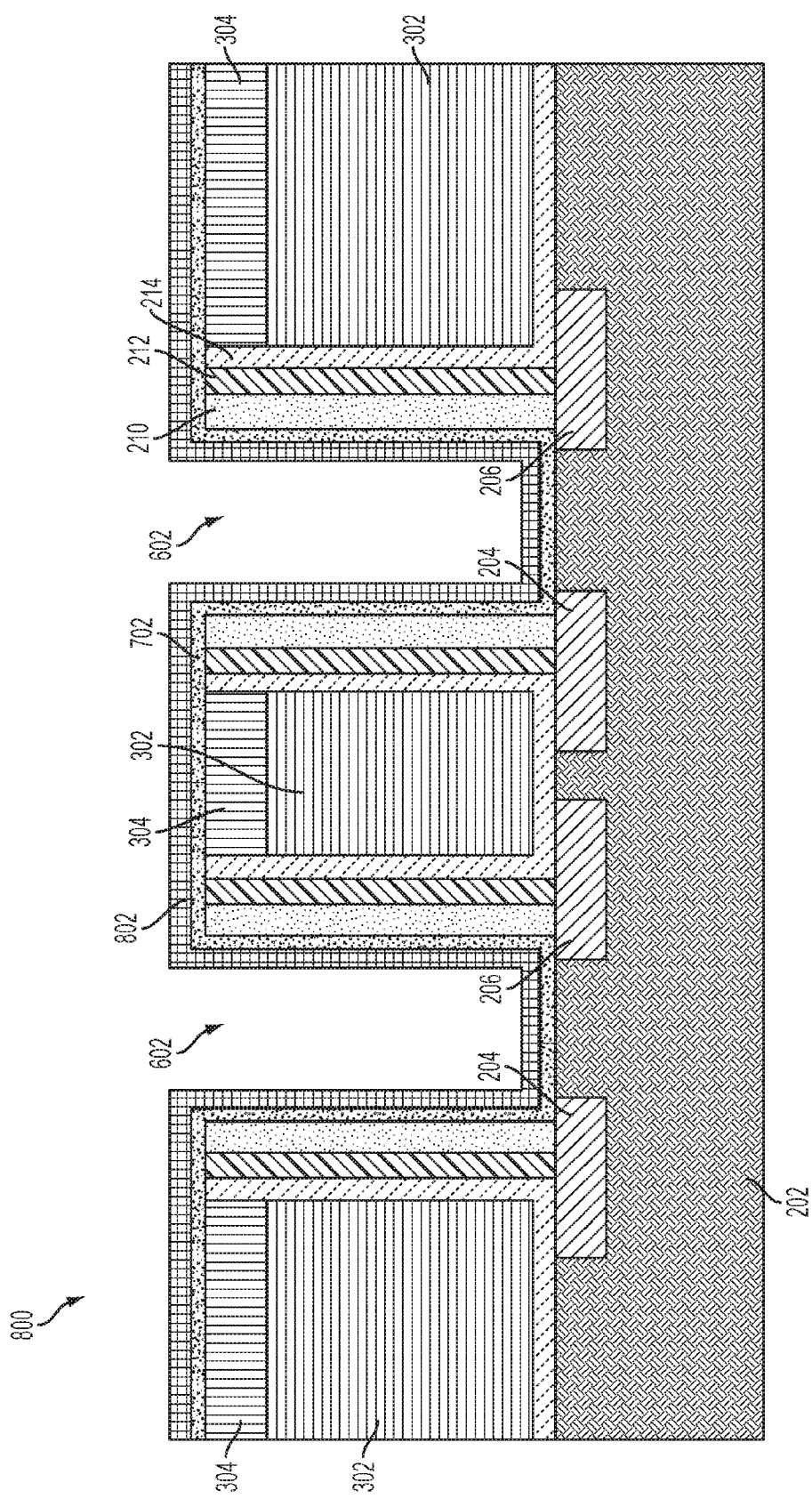
Figure 9:
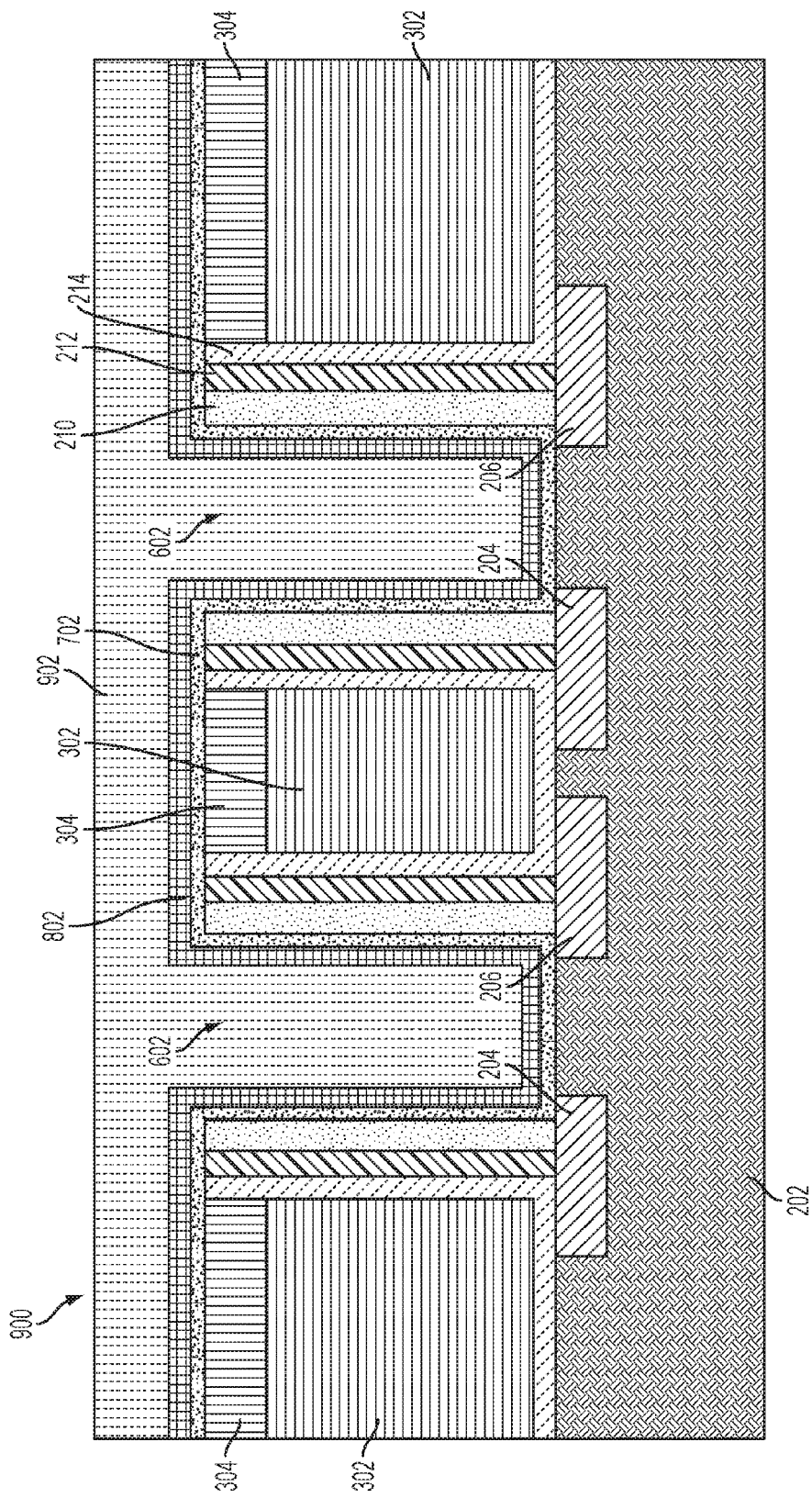

FIG. 6 shows a manufacturing fifth stage 600 in which the dummy gates 208 are removed. Removal of the dummy gates 208 leaves behind gaps 602. FIG. 7 shows a sixth manufacturing stage 700 in which a high-k dielectric layer 702 is deposited. Specific examples of high-k dielectric materials include, but are not limited to: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. The high-k dielectric layer 702 covers exposed surfaces including exposed substrate surfaces in the gaps 602, the sides of the nitride liner 210 and the top oxide layer portions 304. FIG. 8 shows a seventh manufacturing stage 800 in which a titanium nitride layer (metal gate portion) 802 is deposited. The titanium nitride layer 802 covers the high-k dielectric layer 702. FIG. 9 shows an eighth manufacturing stage 900 in which a low resistivity metal such as aluminum (Al) or tungsten (W) is deposited in the gaps 602 to complete a gate stack.

At raised temperatures used in annealing, oxygen is prevented or inhibited from migrating from the flowable oxide 302 into the high-k dielectric layer 702 due to the presence of the top oxide layer portion 304. The completed transistor of the present invention therefore includes a high-k dielectric layer 702 in the gap 602 that has a reduced amount of oxygen therein in comparison to a high-k dielectric layer 114 of a transistor 100 (FIG. 1) manufactured using conventional methods. As a result, various electrical properties of the transistor of the present invention are improved, such as a threshold voltage Vt.

Figure 10:
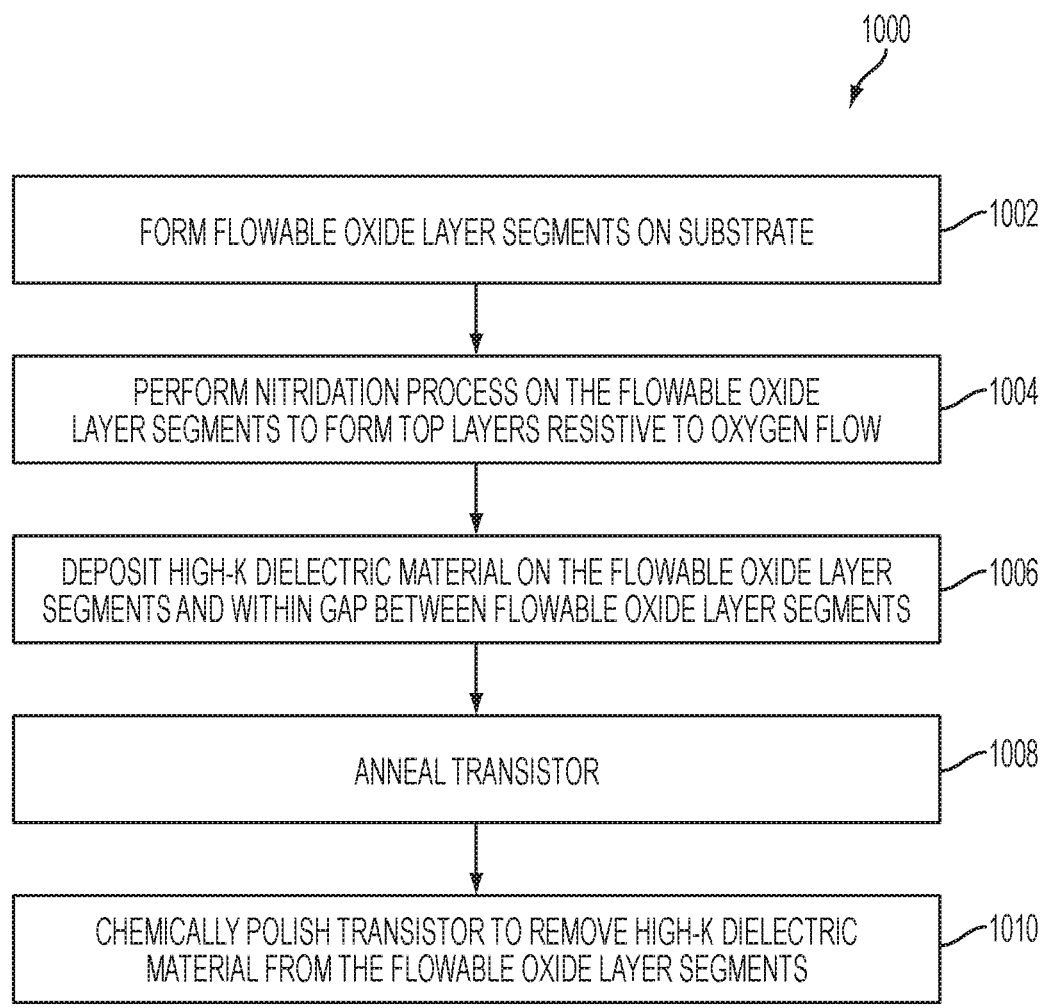
FIG. 10 shows a flowchart illustrating the method disclosed herein for manufacturing a transistor with low oxygen concentration in the high-k dielectric layer.

FIG. 10 shows a flowchart 1000 illustrating the method disclosed herein for manufacturing an HKMG transistor with low oxygen concentration in the high-k dielectric layer. In Box 1002, a plurality of flowable oxide layers are formed on a substrate. In Box 1004, a nitridation process is performed on the flowable oxide layers to create top oxide layer portions 304 that are resistive to oxygen flow. In Box 1006, a layer of high-k dielectric material is deposited on the flowable oxide layers as well as exposed surfaces in the gap between the flowable oxide layers. In Box 1008, the transistor is annealed at elevated temperatures. In Box 1010, the transistor is chemically polished to remove the segments of the high-k dielectric layer on the top of the flowable oxide layers 302, leaving a high-k dielectric layer in the gap to form the gate lining.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of reducing a migration of oxygen into a high-k dielectric layer of a semiconducting device, comprising:
   forming a substrate;
   forming dummy gates on the substrate, the dummy gates separated by at least one first gap;
   depositing a flowable oxide into the at least one first gap to form an oxide layer of the semiconducting device on the substrate;
   altering a chemical composition of a top portion of the oxide layer by diffusing nitrogen into the top portion;
   removing the dummy gates to define at least one second gap;
   depositing the high-k dielectric layer on the top portion of the oxide layer and the at least one second gap to form the semiconducting device, wherein the altered chemical composition of the top portion of the oxide layer reduces migration of oxygen into the high-k dielectric layer and diffuses nitrogen into the top portion of the oxide layer;
   depositing a titanium nitride layer on the high-k dielectric layer;
   depositing a low resistivity metal into the at least one second gap; and
   annealing the semiconductor device, wherein the top portion of the oxide layer prevents migration of oxygen from the oxide layer into the high-k dielectric layer during the annealing.

* * * * *